United States Patent [19]

Nakano et al.

[11] Patent Number: 4,528,262

[45] Date of Patent: Jul. 9, 1985

[54] PROCESS FOR FORMING PHOTORESIST IMAGES

[75] Inventors: Yoshio Nakano, Osaka; Masao Tonda, Sakai, both of Japan

[73] Assignee: Nippon Gohsei Kagaku Kogyo Kabushiki Kaisha, Osaka, Japan

[21] Appl. No.: 484,269

[22] Filed: Apr. 12, 1983

[30] Foreign Application Priority Data

Apr. 13, 1982 [JP] Japan ................... 57-62200

[51] Int. Cl.$^3$ .................. G03C 1/495; G03C 5/00
[52] U.S. Cl. ..................... 430/325; 430/271; 430/273; 430/309; 430/326
[58] Field of Search ............. 430/271, 274, 289, 273, 430/309, 325, 326

[56] References Cited

U.S. PATENT DOCUMENTS

| | | | |
|---|---|---|---|
| 3,458,311 | 7/1969 | Alles | 430/273 |
| 4,268,601 | 5/1981 | Namiki et al. | 430/159 |
| 4,301,230 | 11/1981 | Taguchi et al. | 430/273 |
| 4,469,775 | 9/1984 | Lynch et al. | 430/273 |

OTHER PUBLICATIONS

Kirk–Othmer, *Encylopedia of Chemical Technology*, vol. 21, pp. 353–357, 1970.

*Primary Examiner*—John E. Kittle
*Assistant Examiner*—José G. Dees
*Attorney, Agent, or Firm*—Antonelli, Terry & Wands

[57] ABSTRACT

A process for forming photoresist images by sticking photosensitive layer formed on a film of a polyvinyl alcohol resin which is not soluble in water, but is swellable with water, to a substrate, exposing the photosensitive layer to light through the polyvinyl alcohol resin film, washing away the polyvinyl alcohol resin film with water and developing the photosensitive layer with a developer.

4 Claims, No Drawings

PROCESS FOR FORMING PHOTORESIST IMAGES

BACKGROUND OF THE INVENTION

The present invention relates to a process for forming photoresist images which is used in preparation of a printed wiring board, a lithographic press plate and the like.

Hitherto, for forming photoresist images, there is applied a laminate film in which a photosensitive layer is formed on a light-permeable support such as a polyethylene terephthalate film, and if necessary, a protective film such as a polyethylene film is laminated on the photosensitive layer. In forming photoresist images, the protective film is peeled off from the laminate film, the photosensitive layer is stuck to a substrate such as a copper plate and is imagewise exposed to light through the support, the support is then peeled off and the exposed resist is developed by washing away the unexposed area with a solvent or an aqueous solution of an alkali which results in a substrate bearing a resist image on its surface.

However, a film such as a terephthalate film used as a light-permeable support often sticks to the hand on peeling off and is absorbs dust owing to static electricity. Also, it is very difficult to peel off the support from a substrate automatically.

It is proposed, as disclosed in Japanese Unexamined Patent Publication (Tokkyo Kokai) No. 140341/1981, to employ a water-soluble polyvinyl alcohol resin film as a support for the purpose of effectively removing the support film from the substrate. This support film can be easily removed by washing away with water or an aqueous alkali solution without mechanically peeling off. However, the polyvinyl alcohol resin inevitably accumlates in the washing water and the concentration of the polyvinyl alcohol resin increases gradually, since the water or the aqueous alkali solution is reused circularly. When the concentration reaches a high concentration over 3 to 5% by weight, effective removal can be no longer carried out because the rate of dissolving the polyvinyl alcohol resin is remarkably lowered, and the washing water is apt to foam. On the other hand, removal of the polyvinyl alcohol resin from washing water is uneconomical.

It is an object of the present invention to eliminate the disadvantages of the conventional process for forming photoresist images.

A further object of the invention is to provide a process for forming photoresist images useful for the preparation of a printed wiring board, a lithographic press plate and the like, in which a support film is easily washed away by water or an aqueous alkali solution from a laminate film after exposure of a photosensitive layer.

These and other objects of the present invention will become apparent from the description hereinafter.

SUMMARY OF THE INVENTION

In accordance with the present invention, there is provided a process for forming photoresist images which comprises sticking a laminate of (A) a layer of a polyvinyl alcohol resin which is not soluble in water, but is swellable with water and (B) a photosensitive layer, to a substrate so that the photosensitive layer (B) comes into contact with the substrate, exposing the photosensitive layer (B) to light through the layer (A), washing away the layer (A) with water, and then developing the layer (B).

DETAILED DESCRIPTION

The feature of the present invention resides in using a laminate film consisting of a photosensitive layer and a polyvinyl alcohol resin film which is swollen with water without dissolving in water. When the polyvinyl alcohol resin layer (A) is brought into contact with washing water, the layer is not dissolved in water, but is swollen to partially stretch and shrink. Thus the layer (A) separates from the photosensitive layer (B) in a short period of time and breaks into small fragments to disperse into water.

The polyvinyl alcohol resin film fragments can be readily separated from washing water by filtering the liquid containing the fragments through a wide-meshed wire net or the like. This is practically very advantageous as compared with employing a water-soluble polyvinyl alcohol resin film as a layer (A). Moreover, the speed of removing the water-swellable polyvinyl alcohol resin layer (A) from the photosensitive layer (B) is comparable with the removal of water-soluble polyvinyl alcohol. Also, the removal of the layer (A) by such a means has no bad effect on the subsequent developing step. Further, the process of the invention has the large advantage that the automatization of the step is easier as compared with a process in which a support film is peeled off mechanically.

Polyvinyl alcohol resins used in the present invention are limited to those which swell in water of a temperature within the range of room temperature to about 40° C. without being dissolved therein. If the resins dissolve in the water, solubility limits of the polyvinyl alcohol resins must not be more than 5% by weight, preferably more than 3% by weight. The solubility limit is determined by immersing a polyvinyl alcohol resin film having a size of 10 cm.×10 cm. and a thickness of 10 to 50 μm. in one liter of water at 40° C., agitating for 10 minutes, taking out the swollen film, drying the film and calculating from the difference in weight between the film before immersion and the film after immersion.

Representative polyvinyl alcohol resins usable in the present invention are heat-treated films of polyvinyl alcohol having an average degree of polymerization of 500 to 3,000, preferably 1,000 to 2,500, and a degree of hydrolysis of not less than 94% by mole, preferably not less than 96% by mole. The heat-treatment is carried out at a temperature of 80° to 240° C., preferably 90° to 200° C., for 0.5 second to 60 minutes, preferably 1 second to 10 minutes. Uniaxially or biaxially stretched films can also be used in the invention. Further, it is possible to employ a modified polyvinyl alcohol in the present invention. Examples of the modified polyvinyl alcohol are hydrolyzed copolymers of vinyl acetate and 1 to 40% by mole of α-olefins having 2 to about 20 carbon atoms such as ethylene, propylene, α-heptene, α-octene, α-nonene and α-decene, polyvinyl acetal resins obtained by reacting polyvinyl alcohol with an aldehyde such as formaldehyde, acetoaldehyde, butylaldehyde or glyoxal, hydrolyzed copolymers of vinyl acetate and unsaturated acids such as acrylic acid, methacrylic acid, crotonic acid, maleic acid, fumaric acid and itaconic acid or their esters, and hydrolyzed copolymers of vinyl acetate and vinyl ethers. Heat-treated films and stretched films of these modified polyvinyl alcohols can also be employed in the invention. Since the solubility of these modified polyvinyl alcohols complicatedly varies depending on a combination of the kind of a modifier, the degree of modification and hydrolysis, these conditions are selected so as to accord with the object of the present invention with respect to the respective cases. These polyvinyl alcohol resins may be employed alone or in admixture thereof, and also may be employed in combination with a small amount of starch, cellulose derivatives, water-soluble polyvinyl alcohols or casein. Further, additives such as a plasticizer, a surface active agent and a lubricant may be incorporated in the polyvinyl alcohol resins.

The photosensitive layer used in the present invention is not particularly limited, and any known photosensitive layers of alkali development type and solvent development type can be used.

In the present invention, though a laminate of a polyvinyl alcohol resin layer (A) and a photosensitive layer (B) is enough, a three layer laminate in which a protective layer (C) is laminated on the photosensitive layer (B) may also be employed. In case of the three layer laminate, the layer (C) is peeled off before sticking the laminate film to a substrate. Films of polyethylene terephthalate, polyethylene, polypropylene, polyester and so on are employed as a layer (C).

The thickness of the layer (A) is usually selected from 5 to 100 μm., preferably 10 to 50 μm. The thickness of the photosensitive layer (B) is usually selected from 5 to 100 μm., preferably 10 to 70 μm. A polyvinyl alcohol resin film is produced by known methods such as melt-extrusion and casting. In case of a casting method, water, a water-alcohol mixed solvent and an organic solvent such as dimethylsulfoxide or dimethylformamide are suitably selected as a solvent for the polyvinyl alcohol resins in accordance with the solubility thereof.

The laminate film consisting of the layers (A) and (B) is stuck to a substrate such as copper, copper-clad fiber glass, aluminum and polyamide so that the photosensitive layer (B) comes into contact with the substrate with heated resilient pressure rolls. A photomask having a pattern such as a circuit pattern is then superposed onto the layer (A), and the laminate is exposed to an active light such as ultraviolet rays through the photomask.

After the exposure, the polyvinyl alcohol resin layer (A) is removed by contact with washing water. The polyvinyl alcohol resin layer used in the invention is not dissolved in water, but is swollen because the polyvinyl alcohol resin is essentially hydrophilic. Thus, the polyvinyl alcohol resin layer partially stretches and shrinks and is broken into small fragments to disperse in water, whereby the polyvinyl alcohol resin layer is removed. The temperature of water is selected to be from 0° to 50° C., preferably 10° to 40° C. In the present invention, water employed for the removal of the layer (A) may contain a small amount of an alkali. Examples of the alkali are sodium hydroxide, potassium hydroxide, sodium carbonate, sodium hydrogencarbonate, sodium dihydrogenphosphate, disodium hydrogenphosphate, and the like. The amount of the alkali is generally selected from 0.1 to 10% by weight, preferably 0.5 to 5% by weight. Water may also contain a substance which assists the permeation of water, e.g. surface active agents or alcohols. In case of bringing the layer (A) into contact with water, supersonic waves or high-frequency waves may be applied or water may be sprayed from a nozzle onto the layer (A).

After removal of the layer (A), the photosensitive layer (B) is developed by washing away unexposed areas on the substrate with an aqueous alkali solution or an organic solvent such as trichloroethane which results in a substrate bearing resist images on its surface. Also, in case that the photosensitive layer (B) is an alkali-developable type, the removal of the layer (A) and the development of the layer (B) can be carried out simultaneously or subsequently by employing a water containing an alkali.

After the development, this substrate may be subjected to conventional operations of plating, etching, etc. as is well known to those skilled in the art using resist images.

The present invention is more specifically described and explained by means of the following Examples, in which all parts are by weight unless otherwise noted. It is to be understood that the present invention is not limited to the Examples, and various changes and modifications may be made in the invention without departing from the spirit and scope thereof.

EXAMPLE 1

A three layer laminate consisting of a support layer (A), a photosensitive layer (B) and a protective layer (C) was prepared as follows:

Layer (A): A polyvinyl alcohol film having a thickness of 22 μm. was formed by casting an aqueous solution of 100 parts of polyvinyl alcohol (degree of polymerization: 1,800, degree of hydrolysis: 99.8%) dissolved in 400 parts of water, and was heat-treated at 100° C. for 15 seconds.

Layer (B): Alkali soluble type photosensitive acrylic element

A methyl ethyl ketone solution of the photosensitive element (B) was coated with a roll coater on a polyethylene terephthalate film (C) having a thickness of 25 μm., and was dried to form a photosensitive layer (B) having a thickness of 50 μm. on the film (C). Onto the layer (B), the above-mentioned film (A) was laminated by passing through heat rolls.

The photosensitive layer (B) was laminated to a copper-clad laminate with heated pressure rolls at 100° C., while peeling off the film (C) from the three layer laminate. A patterned mask film was superposed on the layer (A), and was exposed to light.

Water of 35° C. was jetted for 1 minute from a nozzle of 1.5 mm. caliber to the surface of the layer (A) at a jet pressure of 1 kg./cm.$^2$ at a distance from the nozzle of 12 cm., whereby the layer (A) was immediately swollen and removed. The fragments of the layer (A) separated from the layer (B) could be easily removed by filtering with a wire net. No polyvinyl alcohol was dissolved in water.

The photosensitive layer on the copper-clad laminate was developed with a 1.3% by weight aqueous solution of sodium carbonate. The obtained photoresist image was fine in resolution and good in tinting strength of through-holes.

EXAMPLE 2

A polyvinyl alcohol film having a thickness of 25 μm. used as a layer (A) was formed by casting an aqueous solution consisting of 70 parts of polyvinyl alcohol (degree of polymerization: 1,800, degree of hydrolysis: 99.7% by mole), 30 parts of polyvinyl alcohol (degree of polymerization: 1,750, degree of hydrolysis: 96.7% by mole), 5 parts of corn starch, 1 part of glycerin and 450 parts of water. The polyvinyl alcohol film was then heat-treated at 110° C. for 30 seconds.

A photosensitive laminate was prepared in the same manner as in Example 1 except that the above heat-treated film was employed as a layer (A). The layer (B) of the laminate was stuck to a copper-clad laminate and exposed to light in the same manner as in Example 1.

Water of 35° C. was jetted from a nozzle of 1.2 mm. caliber to the surface of the layer (A) for 1 minute at a jet pressure of 1 kg./cm.$^2$ at a distance from the nozzle of 10 cm., whereby the layer (A) was immediately swollen and dispersed in water. The fragments of the layer (A) could be easily removed by filtering with a wire net. No polyvinyl alcohol was dissolved in water. The development of the photosensitive layer (B) with an aqueous solution of sodium carbonate could be done without any troubles.

EXAMPLE 3

A hydrolyzed ethylene-vinyl acetate copolymer having an ethylene content of 10% by mole (degree of hydrolysis in vinyl acetate component: 99.3% by mole) was dissolved in a water-n-propanol mixed solvent (8:2 by weight.) A film having a thickness of 15 μm. was formed by casting the solution.

The procedure of Example 1 was repeated except that the above ethylene-vinyl alcohol copolymer film was employed as a layer (A) instead of the polyvinyl alcohol film. The result was good.

EXAMPLE 4

A hydrolyzed α-dodecene-vinyl acetate copolymer having an α-dodecene content of 3% by mole (degree of hydrolysis in vinyl acetate component: 99.5% by mole) was dissolved in dimethylsulfoxide. A film having a thickness of 20 μm. was formed by casting the solution.

The procedure of Example 1 was repeated except that the above α-dodecene-vinyl alcohol copolymer film was employed as a layer (A) instead of the polyvinyl alcohol film. The result was good.

EXAMPLE 5

A three layer laminate consisting of the following layers (A), (B) and (C) was prepared as follows:
Layer (A): The same as in Example 2
Layer (B): Trichloroethane soluble type photosensitive acrylic element
Layer (C): A polyethylene terephthalate film (thickness: 25 μm.

A methyl ethyl ketone solution of the photosensitive element was coated with a roll coater on the surface of the layer (C) and dried to form a photosensitive layer (B) having a thickness of 25 μm. Onto the layer (B), the above-mentioned layer (A) was laminated by passing through heat rolls.

The photosensitive layer (B) was laminated under pressure to a copper-clad laminate with heated pressure rolls, while peeling off the layer (C) from the three layer laminate. A patterned mask film was superposed on the layer (A), and was exposed to light.

Water of 30° C. was jetted from a nozzle to the surface of the layer (A) for 1 minute. The layer (A) was immediately swollen and dispersed in water. The layer (B) was then washed away by spraying water and dried by blowing air. The layer (B) was then developed with 1,1,1-trichloroethane. A good photoresist image having a fine resolution was obtained.

EXAMPLE 6

An acetalized polyvinyl alcohol (rate of acetalization: 30% by mole) was prepared by acetalizing a water-soluble polyvinyl alcohol having a degree of polymerization of 1,700 and a degree of hydrolysis of 99.1% by mole with a mixture of acetoaldehyde and butylaldehyde (1:1 by mole) in the presence of sulfuric acid catalyst. It was dissolved in a water-isopropanol mixed solvent (7:3 by weight) and the solution was cast to form a film having a thickness of 18 μm.

The procedure of Example 1 was repeated except that the above acetalized polyvinyl alcohol film was employed as a layer (A) instead of the polyvinyl alcohol film. The result was good.

EXAMPLE 7

The same photosensitive laminate as in Example 1 having the polyvinyl alcohol film as a layer (A) was prepared. The layer (B) was stuck to a copper-clad laminate and exposed to light in the same manner as in Example 1.

A 1.3% by weight aqueous solution of sodium carbonate (temperature: 33° C.) was jetted from a nozzle of 1.5 mm. caliber to the surface of the layer (A) for 2 minutes at a jet pressure of 1.1 kg./cm.$^2$ at a distance from the nozzle of 12 cm. The layer (A) was swollen and removed in about 30 seconds. The fragments of the layer (A) dispersed in water could be easily removed by filtering with a wire net. The photosensitive layer (B) was developed simultaneously with the removal of the layer (A). The resolution was fine and no troubles were observed.

In addition to the ingredients used in the Examples, other ingredients can be used in the Examples as set forth in the specification to obtain substantially the same results.

What we claim is:

1. A process for forming photoresist images which comprises sticking a laminate of (A) a heat-treated film of a polyvinyl alcohol which is not soluble in water, but is swellable with water and has an average degree of polymerization of 500 to 3,000 and a degree of hydrolysis of not less than 94% by mole and (B) a photosensitive layer, to a substrate so that the photosensitive layer (B) comes in contact with the substrate, exposing the photosensitive layer (B) to light through the film (A), washing away the film (A) with water as small film fragments, and then developing the layer (B) with an aqueous alkali solution or an organic solution.

2. The process of claim 1, wherein said heat-treated film is obtained by heat-treating a film of polyvinyl alcohol at a temperature of 80° to 240° C. for 0.5 second to 60 minutes.

3. The process of claim 1, wherein said film (A) is washed with water having a temperature of from 0° to 50° C.

4. The process of claim 3, wherein said water for washing away the film (A) is sprayed as a jet from a nozzle and the thickness of the film (A) is from 5 to 100 μm and the thickness of the photosensitive layer (B) is from 5 to 100 μm.

* * * * *